(12) United States Patent
Maeda et al.

(10) Patent No.: US 12,280,578 B2
(45) Date of Patent: Apr. 22, 2025

(54) METHOD FOR REPAIRING ELECTROSTATIC CHUCK DEVICE

(71) Applicant: SUMITOMO OSAKA CEMENT CO., LTD., Tokyo (JP)

(72) Inventors: Keisuke Maeda, Tokyo (JP); Yuuki Kinpara, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 117 days.

(21) Appl. No.: 18/022,268

(22) PCT Filed: Aug. 30, 2021

(86) PCT No.: PCT/JP2021/031729
§ 371 (c)(1),
(2) Date: Feb. 20, 2023

(87) PCT Pub. No.: WO2022/070721
PCT Pub. Date: Apr. 7, 2022

(65) Prior Publication Data
US 2023/0321968 A1 Oct. 12, 2023

(30) Foreign Application Priority Data
Sep. 30, 2020 (JP) .................................. 2020-164776

(51) Int. Cl.
*B32B 37/12* (2006.01)
*B32B 7/12* (2006.01)
(Continued)

(52) U.S. Cl.
CPC ............... *B32B 37/12* (2013.01); *B32B 7/12* (2013.01); *B32B 9/041* (2013.01); *B32B 2255/26* (2013.01); *B32B 2307/304* (2013.01); *B32B 2307/54* (2013.01); *B32B 2309/02* (2013.01); *B32B 2311/00* (2013.01);
(Continued)

(58) Field of Classification Search
CPC ....................................................... B32B 37/12
See application file for complete search history.

(56) References Cited

U.S. PATENT DOCUMENTS 8,252,132 B2  8/2012  Yoshioka et al.
9,017,786 B2  4/2015  Yoshioka et al.
(Continued)

FOREIGN PATENT DOCUMENTS

JP       H0774234      3/1995
JP       2010165776    7/2010
(Continued)

OTHER PUBLICATIONS

"International Search Report (Form PCT/ISA/210) of PCT/JP2021/031729", mailed on Nov. 9, 2021, with English translation thereof, pp. 1-4.

*Primary Examiner* — Jeffry H Aftergut
(74) *Attorney, Agent, or Firm* — JCIPRNET (57) ABSTRACT

A method for repairing an electrostatic chuck device that is formed by bonding an electrostatic chuck member made of ceramics and a temperature-controlling base member made of metal with a first adhesive layer sandwiched therebetween is provided. The method includes a step of repairing the first adhesive layer that has been eroded by using a cold-curing adhesive.

13 Claims, 1 Drawing Sheet

(51) Int. Cl.
    *B32B 9/04* (2006.01)
    *H01L 21/683* (2006.01)
(52) U.S. Cl.
    CPC ....... *B32B 2315/02* (2013.01); *B32B 2457/00* (2013.01); *H01L 21/6833* (2013.01)

(56) References Cited

U.S. PATENT DOCUMENTS 10,923,381 B2   2/2021  Kosakai et al.
2010/0177455 A1 * 7/2010  Yoshioka ............ H01L 21/6831
                                                   29/402.18

FOREIGN PATENT DOCUMENTS

| JP | 2016-533039 A | * | 10/2016 |
| JP | 2019176064 | | 10/2019 |
| KR | 10-2020-0131667 A | * | 11/2020 |
| KR | 10-2219255 B1 | * | 2/2021 |
| WO | 2017126534 | | 7/2017 |
| WO | WO-2017/126534 A1 | * | 7/2017 |

* cited by examiner

METHOD FOR REPAIRING ELECTROSTATIC CHUCK DEVICE

CROSS-REFERENCE TO RELATED APPLICATION

This application is a 371 application of the International PCT application serial no. PCT/JP2021/031729, filed on Aug. 30, 2021, which claims the priority benefits of Japan Patent Application No. 2020-164776, filed on Sep. 30, 2020. The entirety of each of the above-mentioned patent applications is hereby incorporated by reference herein and made a part of this specification.

TECHNICAL FIELD

The present invention relates to a method for repairing an electrostatic chuck device.

BACKGROUND ART

In recent years, in a semiconductor manufacturing process, further improvements in microfabrication technology are required as elements become more highly integrated and have higher performance. The etching technique in the semiconductor manufacturing process is one of the important microfabrication technologies. In recent years, among the etching techniques, the plasma etching technique, which enables high-efficiency to be achieved and enables large-area microfabrication, has become mainstream.

The plasma etching technique is one type of dry etching techniques. The plasma etching technique is a technique of forming a resist mask pattern on a solid material to be processed, introducing a reactive gas into a vacuum while the solid material is supported in the vacuum, applying a high-frequency electric field to the reactive gas, causing accelerated electrons to collide with gas molecules to be a plasma state, causing a reaction of radicals (free radicals) and ions generated from this plasma with the solid material to obtain a reaction product, and removing the reaction product, thereby forming fine patterns on the solid material.

On the other hand, there is a plasma CVD method as one of thin film growth techniques of combining raw material gases by the action of plasma and depositing the obtained compound on a substrate. The plasma CVD method is a film formation method of discharging plasma by applying a high-frequency electric field to a gas containing raw material molecules, decomposing the raw material molecules by electrons accelerated by this plasma discharge, and depositing the resulting compound. Reactions that could not occur only by thermal excitation at a low temperature are possible in plasma because gases in the system collide with each other and are activated to be radicals.

In such a semiconductor manufacturing process, there are steps in which halogen-based corrosive gases such as fluorine-based corrosive gases and chlorine-based corrosive gases and plasmas thereof are used, and fluorine-based gases such as $CF_4$, $SF_6$, HF, $NF_3$, and $F_2$, and chlorine-based gases such as $Cl_2$, $SiCl_4$, $BCl_3$, and HCl are used in steps such as dry etching, plasma etching, and cleaning.

In the related art, in semiconductor manufacturing apparatuses using plasma, such as plasma etching apparatuses and plasma CVD apparatuses, an electrostatic chuck device has been used as a device for simply placing and holding a wafer on a stage and maintaining the wafer at a desired temperature.

An electrostatic chuck device formed by bonding an electrostatic chuck member made of ceramics and a temperature-controlling base member made of metal with an adhesive layer sandwiched therebetween is often used. In the electrostatic chuck device, an exposed portion of the adhesive layer between the temperature-controlling base member and the electrostatic chuck member is etched and eroded by plasma during wafer processing. In a case in which the adhesive layer is eroded in this manner, the thermal conductivity between the electrostatic chuck member and the temperature-controlling base member differs between an outer peripheral portion and a central portion of the electrostatic chuck member. As a result, it is difficult to uniformly dissipate heat from the wafer, which has reached a high temperature due to etching, from the temperature-controlling base member through the electrostatic chuck member and the adhesive layer. Thus, the temperature of the wafer is non-uniform, and the wafer warps, so that a desired etching process cannot be performed. As a method for repairing the eroded adhesive layer, for example, a method of winding a thread-like adhesive around a side surface of the eroded adhesive layer and then heat-pressing is known (for example, see Patent Literature No. 1).

In addition, the electrostatic chuck device is provided with a through-hole for separating a plate-shaped sample from a chuck surface or introducing a cooling gas. An insulating sleeve is disposed in the through-hole to increase the withstand voltage of the electrostatic chuck device. In such an electrostatic chuck device, plasma may penetrate through a through-hole for gas flow and a through-hole for inserting a pin for separating the wafer from the chuck surface, and may erode the adhesive layer. The adhesive layer has a function of holding the electrostatic chuck member and the temperature-controlling base member in a state of ensuring insulation, and performing uniform heat conduction between the electrostatic chuck member and the temperature-controlling base member. Plasma erosion of the adhesive layer around the through-hole not only reduces the withstand voltage and shortens the life of the electrostatic chuck device, but also causes temperature changes around the through-hole over time. In order to suppress the erosion of the adhesive layer around the through-hole, for example, an electrostatic chuck device including an electrostatic chuck part which incorporates an internal electrode for electrostatic attraction and has a placing surface on which a plate-shaped sample is placed, a base part which cools the electrostatic chuck part, and an adhesion layer which bonds the electrostatic chuck part and the base part to integrate the parts together, in which a first through-hole is provided in the electrostatic chuck part, a second through-hole that communicates with the first through-hole is provided in the base part, a tubular insulator is fixed in the second through-hole, an annular sealing member is sandwiched between the electrostatic chuck part and a distal end surface on the side of the electrostatic chuck of the tubular insulator, and a tubular insulating wall member is located at the inner side of the annular sealing member in the radial direction, is known (for example, see Patent Literature No. 2).

CITATION LIST

Patent Literature

[Patent Literature No. 1] Japanese Laid-open Patent Publication No. 2010-165776

[Patent Literature No. 2] Pamphlet of International Publication No. WO2017/126534

SUMMARY OF INVENTION

Technical Problem

However, as described in Patent Literature No. 1, in a case in which a thread-like adhesive was wound around the side surface of the eroded adhesive layer and then heat-pressed, a thermal expansion difference occurred between the temperature-controlling base member and the electrostatic chuck member, and the electrostatic chuck member was separated.

In addition, in the electrostatic chuck device described in Patent Literature No. 2, it was necessary to remove an insulator during the repair of the adhesive layer, and the repair was not easy.

The present invention has been made in view of the above circumstances, and an object thereof is to provide a method for repairing an electrostatic chuck device capable of easily repairing an adhesive layer of the electrostatic chuck device that has been eroded by etching and capable of preventing the occurrence of internal stress in the adhesive layer after repair.

Solution to Problem

In order to solve the above problems, a first aspect of the present invention is to provide a method for repairing an electrostatic chuck device that is formed by bonding an electrostatic chuck member made of ceramics and a temperature-controlling base member made of metal with a first adhesive layer sandwiched therebetween, in which the method includes a step of repairing the first adhesive layer that has been eroded by using a cold-curing adhesive.

In the first aspect of the present invention, in the step, the first adhesive layer that has been eroded may be repaired at a position between an outer periphery of the electrostatic chuck member and the temperature-controlling base member.

In the first aspect of the present invention, a cooling gas introduction hole may be provided to penetrate through the electrostatic chuck member and the temperature-controlling base member in a thickness direction thereof, an insulator made of ceramics may be provided in the cooling gas introduction hole to be bonded to a second adhesive layer, and the method may further include a step of repairing the second adhesive layer that has been eroded by using a cold-curing adhesive.

In the first aspect of the present invention, a curing temperature of the cold-curing adhesive may be −25° C. or higher and 75° C. or lower.

In the first aspect of the present invention, a viscosity of the cold-curing adhesive may be less than 100 Pa·s.

In the first aspect of the present invention, an elastic modulus of the cold-curing adhesive may be 100 MPa or less.

Advantageous Effects of Invention

According to the present invention, it is possible to provide the method for repairing an electrostatic chuck device capable of easily repairing an adhesive layer of the electrostatic chuck device that has been eroded by etching and capable of preventing the occurrence of internal stress in the adhesive layer after repair.

DESCRIPTION OF EMBODIMENTS

Hereinafter, an example of an embodiment of a method for repairing an electrostatic chuck device according to the present invention will be described with reference to the drawings. In the drawings used in the following description, feature portions are illustrated in an enlarged manner for convenience, and the dimensional ratios and the like of each component may differ from the actual ones. In addition, materials, dimensions, and the like exemplified in the following description are examples, and the present invention is not limited thereto, and can be changed as appropriate without changing the gist of the invention.

Method for Repairing Electrostatic Chuck Device

A method for repairing an electrostatic chuck device according to the embodiment of the present invention is a method for repairing an electrostatic chuck device that is formed by bonding an electrostatic chuck member made of ceramics and a temperature-controlling base member made of metal with a first adhesive layer sandwiched therebetween, and is used for repairing the first adhesive layer that has been eroded by using a cold-curing adhesive.

"Electrostatic Chuck Device"

Figure 1:
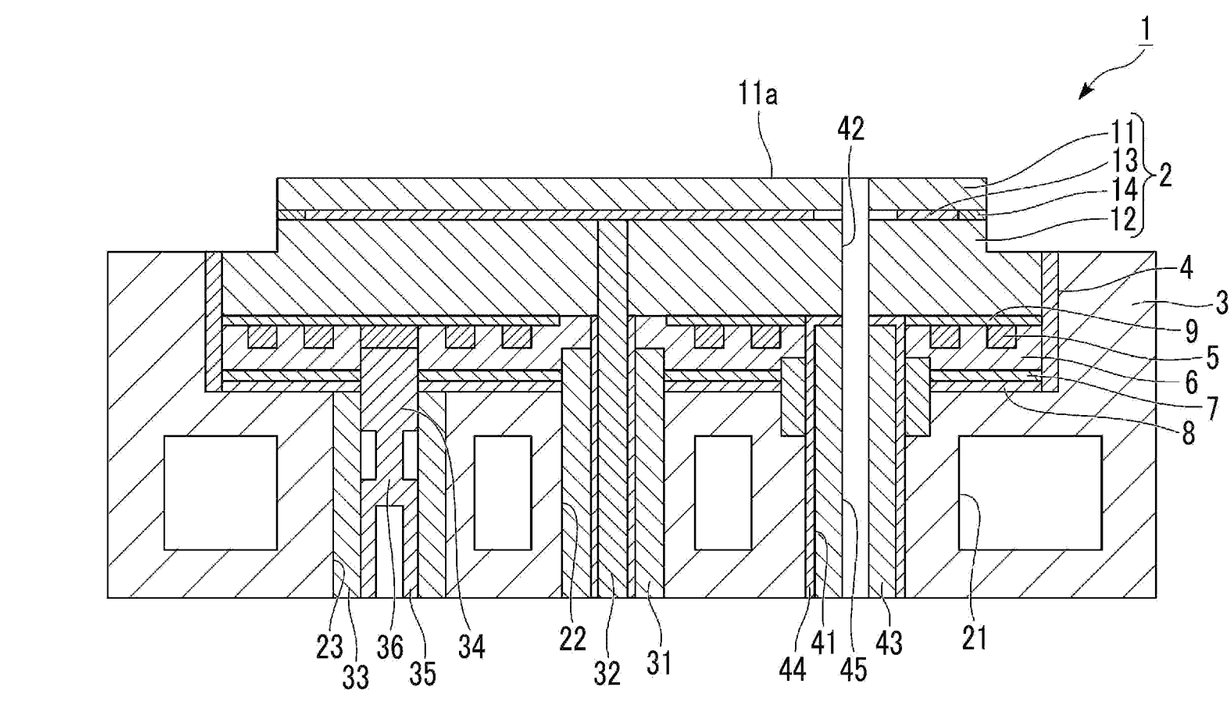
The figure is a schematic cross-sectional view illustrating an example of an electrostatic chuck device to be repaired by a method for repairing an electrostatic chuck device according to an embodiment of the present invention.

First, an example of an electrostatic chuck device to be repaired by the method for repairing an electrostatic chuck device of the present embodiment will be described with reference to the figure.

The figure is a cross-sectional view illustrating the electrostatic chuck device according to the present embodiment.

As illustrated in the figure, an electrostatic chuck device 1 according to the present embodiment includes a disk-shaped electrostatic chuck member 2, a disk-shaped temperature-controlling base member 3 for controlling a temperature of the electrostatic chuck member 2 to become a desired temperature, and an adhesive layer (first adhesive layer) 4 that bonds and integrates the electrostatic chuck member 2 and the temperature-controlling base member 3. Furthermore, the electrostatic chuck device 1 includes a heater element (heating member) 5 provided between the electrostatic chuck member 2 and the temperature-controlling base member 3, and an organic insulating adhesive layer 6 for embedding the heater element 5, and bonding and integrating the electrostatic chuck member 2 and the temperature-controlling base member 3. A protective layer 7 and an adhesive layer (third adhesive layer) 8 are provided between the electrostatic chuck member 2 and the temperature-controlling base member 3 in a thickness direction thereof.

The temperature-controlling base member 3 is provided to partially surround the outer periphery of the electrostatic chuck member 2. Therefore, the adhesive layer 4 is provided between apart of the outer periphery of the electrostatic chuck member 2 and the temperature-controlling base member 3 surrounding a part of the outer periphery of the electrostatic chuck member 2.

"Electrostatic Chuck Member"

The electrostatic chuck member 2 includes a placement plate 11 made of ceramics, which serves as a placement surface 11a for placing a plate-shaped sample such as a semiconductor wafer on an upper surface thereof, and a supporting plate 12 provided on a surface side opposite to the placement surface 11a of the placement plate 11, an electrostatic attraction electrode 13 sandwiched between the placement plate 11 and the supporting plate; and an annular insulating material 14 surrounding electrostatic attraction electrode 13 sandwiched between the placement plate 11 and the supporting plate 12.

"Placement Plate"

A large number of projections (not illustrated) for supporting the plate-shaped sample such as a semiconductor wafer are provided to stand on the placement surface 11a of the placement plate 11. Furthermore, an annular projection portion having a rectangular cross section may be provided around the periphery of the placement surface 11a of the placement plate 11 to encircle this periphery so that leakage of a cooling gas such as helium (He) is prevented. Furthermore, in an area surrounded by the annular projection portion on the placement surface 11a, a plurality of projection portions each of which has the same height as the annular projection portion and has a circular cross-section and a substantially rectangular vertical cross-section may be provided.

Materials of the placement plate 11 are not particularly limited as long as it has a volume resistivity value of about $10^{13}$ Ω·cm or more and $10^{15}$ Ω·cm or less, has mechanical strength, and is resistant to corrosive gas and its plasma. Examples of such materials include an aluminum oxide ($Al_2O_3$) sintered body, an aluminum nitride (AlN) sintered body, an aluminum oxide ($Al_2O_3$)-silicon carbide (SiC) composite sintered body, and the like, but from the viewpoint of dielectric properties at high temperature, high corrosion resistance, plasma resistance, and heat resistance, an aluminum oxide ($Al_2O_3$)-silicon carbide (SiC) composite sintered body is preferred.

"Supporting Plate"

The supporting plate 12 supports the placement plate 11 and the electrostatic attraction electrode 13 from below.

Materials of the supporting plate 12 are the same as the materials of the placement plate 11.

"Electrostatic Attraction Electrode"

By applying a voltage to the electrostatic attraction electrode 13, an electrostatic attraction force is generated to hold the plate-shaped sample on the placement surface 11a of the placement plate 11.

The electrostatic attraction electrode 13 is a composite of an insulating substance and a conductive substance.

The insulating substance contained in the electrostatic attraction electrode 13 is not particularly limited, but for example, it is preferable to use at least one selected from the group consisting of aluminum oxide ($Al_2O_3$), aluminum nitride (AlN), silicon nitride ($Si_3N_4$), yttrium (III) oxide ($Y_2O_3$), yttrium aluminum garnet (YAG), and $SmAlO_3$.

As the conductive substance contained in the electrostatic attraction electrode 13, it is preferable to use at least one selected from the group consisting of molybdenum carbide ($Mo_2C$), molybdenum (Mo), tungsten carbide (WC), tungsten (W), tantalum carbide (TaC), tantalum (Ta), silicon carbide (SiC), carbon black, carbon nanotubes, and carbon nanofibers.

"Insulating Material"

The insulating material 14 is used to surround the electrostatic attraction electrode 13 and protect the electrostatic attraction electrode 13 from the corrosive gas and its plasma.

The placement plate 11 and the supporting plate 12 are bonded and integrated by the insulating material 14 via the electrostatic attraction electrode 13.

The insulating material 14 is provided to bond a boundary portion between the placement plate 11 and the supporting plate 12, that is, an outer edge area other than a portion where the electrostatic attraction electrode 13 is formed. A shape of the insulating material 14 (a shape of the insulating material 14 viewed in plan view (viewed from the thickness direction)) is not particularly limited, and is appropriately adjusted according to a shape of the electrostatic attraction electrode 13.

In the electrostatic chuck device 1, a thickness of the insulating material 14 is equal to a thickness of the electrostatic attraction electrode 13.

The insulating material 14 is made of an insulating substance.

The insulating substance constituting the insulating material 14 is not particularly limited, but it is preferable to use a substance having the same component as main components of the placement plate 11 and the supporting plate 12, and examples thereof include aluminum oxide ($Al_2O_3$), aluminum nitride (AlN), yttrium oxide ($Y_2O_3$), yttrium aluminum garnet (YAG), and the like. The insulating substance constituting the insulating material 14 is preferably aluminum oxide ($Al_2O_3$). Since the insulating substance constituting the insulating material 14 is aluminum oxide ($Al_2O_3$), dielectric properties at high temperature, high corrosion resistance, plasma resistance, and heat resistance are achieved.

"Temperature-Controlling Base Member"

The temperature-controlling base member 3 is a thick disk-shaped member made of at least one of metal or ceramics. A body of the temperature-controlling base member 3 is configured to also serve as an internal electrode for plasma generation. A flow path 21 through which a cooling medium such as water, He gas, or N2 gas is circulated is formed inside the body of the temperature-controlling base member 3.

The body of the temperature-controlling base member 3 is connected to an external high-frequency power source (not illustrated). In addition, an electrode pin 32 whose outer periphery is surrounded by an insulating material 31 is fixed by the insulating material 31 in a fixing hole (first fixing hole) 22 of the temperature-controlling base member 3. The electrode pin 32 has one end connected to the electrostatic attraction electrode 13 and an other end connected to an external direct current power source (not illustrated). In addition, an electrode pin 34 and a connection terminal 35 whose outer peripheries are surrounded by an insulating material 33 are fixed by the insulating material 33 in a fixing hole (second fixing hole) 23 of the temperature-controlling base member 13. The electrode pin 34 and the connection terminal 35 are connected via a connection line 36. The electrode pin 34 is connected to the heater element 5. The connection terminal 35 is connected to the external direct current power source (not illustrated).

The electrode pin 32 supplies an electric current to the electrostatic attraction electrode 13.

The electrode pin 34 supplies an electric current to the heater element 5.

The connection terminal 35 supplies an electric current to the electrode pin 34.

Materials constituting the temperature-controlling base member 3 are not particularly limited as long as it is a metal having excellent thermal conductivity, electrical conductivity, and workability, or a compound material containing these metals. As the materials constituting the temperature-controlling base member 3, aluminum (Al), copper (Cu), stainless steel (SUS), titanium (Ti), and the like, for example, are suitably used.

At least a surface of the temperature-controlling base member 3, which is exposed to plasma, is preferably alumite-treated or resin-coated with a polyimide-based resin. In addition, it is more preferable that the entire surface of the temperature-controlling base member 3 is alumite-treated or resin-coated. Since the temperature-controlling base member 3 is alumite-treated or resin-coated, plasma resistance of the temperature-controlling base member 3 is improved, and abnormal discharge is prevented. Therefore, the plasma resistance stability of the temperature-controlling base member 3 is improved, and the surface damage of the temperature-controlling base member 3 can be prevented.

"Adhesive Layer (First Adhesive Layer)"

The adhesive layer 4 bonds and integrates the electrostatic chuck member 2 and the temperature-controlling base member 3, and may include a spacer made of a polygonal bulk body in a case in which the electrostatic chuck member 2 is viewed in plan view.

The adhesive layer 4 is made of, for example, a cured body obtained by heating and curing a silicone-based resin composition, an acrylic resin, an epoxy resin, or the like.

A silicone-based resin composition is a silicon compound having a siloxane bond (Si—O—Si) and is a resin excellent in heat resistance and elasticity, which is therefore more preferable.

As such a silicone-based resin composition, a silicone resin having a thermosetting temperature of 70° C. to 140° C. is particularly preferable.

Here, in a case in which the thermosetting temperature is lower than 70° C., curing does not proceed sufficiently during the bonding process when the electrostatic chuck member 2 and the temperature-controlling base member 3 are opposed and bonded to each other, which causes inferior workability and is not preferable. On the other hand, in a case in which the thermosetting temperature is higher than 140° C., the thermal expansion difference between the adhesive layer 4, and the electrostatic chuck member 2 and the temperature-controlling base member 3 becomes large, the stress between the electrostatic chuck member 2 and the temperature-controlling base member 3 increases, and separation of the adhesive layer 4 from the electrostatic chuck member 2 and the temperature-controlling base member 3 may occur, which is not preferable.

"Spacer"

A spacer is used to bond the electrostatic chuck member 2 and the temperature-controlling base member 3 with a constant thickness. As materials for spacers, materials that do not have high dielectric loss (tanσ), for example, a sintered body such as alumina ($Al_2O_3$), silicon nitride ($Si_3N_4$), zirconia ($ZrO_2$), and an organic compound such as polyimide are preferably used. Materials with high dielectric loss such as a silicon carbide (SiC) sintered body, a metal plate such as aluminum (Al), and a magnetic material such as ferrite ($Fe_2O_3$) can cause discharge, which is not preferable.

"Organic Insulating Adhesive Layer"

The organic insulating adhesive layer 6 bonds and integrates the heater element 5, which is bonded to a lower surface of the electrostatic chuck member 2 via the adhesive 9, and the temperature-controlling base member 3 in a state of facing each other, and has a function of relaxing thermal stress. The organic insulating adhesive layer 6 is made of, for example, a silicone resin or an acrylic resin obtained by heating and curing a silicone-based resin composition.

"Protective Layer"

The protective layer 7 is provided between the organic insulating adhesive layer 6 and the temperature-controlling base member 3 to protect the organic insulating adhesive layer 6. The protective layer 7 is made of, for example, a polyimide sheet.

"Adhesive Layer (Third Adhesive Layer)"

The adhesive layer 8 is provided between the protective layer 7 and the temperature-controlling base member 3 to bond the protective layer 7 and the temperature-controlling base member 3 together. The adhesive layer 8 is made of, for example, a polyimide sheet adhesive or an epoxy sheet adhesive.

"Gas Introduction Hole"

The electrostatic chuck device 1 includes a fixing hole (third fixing hole) 41 penetrating the temperature-controlling base member 3 and the organic insulating adhesive layer 6 in the thickness direction, and a gas introduction hole (first gas introduction hole) 42 penetrating the electrostatic chuck member 2 in the thickness direction and communicating with the fixing hole 41. A cylindrical insulator 43 having insulating properties is fixed to the fixing hole 41 via an adhesive layer (second adhesive layer) 44. The insulator 43 has a through-hole (gas introduction hole, second gas introduction hole) 45 serving as a central axis thereof. The first gas introduction hole 42 and the second gas introduction hole 45 communicate with each other while the insulator 43 is fixed to the fixing hole 41.

The adhesive layer 44 is made of the same adhesive as the adhesive layer 4.

"Method for Repairing Electrostatic Chuck Device"

In a case in which the electrostatic chuck device 1 is exposed to an etching environment, a portion of the adhesive layer (first adhesive layer) 4 exposed to the placement surface 11*a* side of the placement plate 11, the adhesive layer 4 being formed between the outer periphery of the electrostatic chuck member 2 and the temperature-controlling base member 3, may be eroded by plasma. In addition, in a case in which the electrostatic chuck device 1 is exposed to the etching environment, plasma penetrates into the device through the first gas introduction hole 42, and a portion of the adhesive layer (second adhesive layer) 44 exposed to the first gas introduction hole 42 may be eroded.

Therefore, in the method for repairing an electrostatic chuck device of the present embodiment, the first adhesive layer 4 that is disposed between the outer periphery of the electrostatic chuck member 2 and the temperature-controlling base member 3 and that has been eroded is repaired by using a cold-curing adhesive. In a case in which the first adhesive layer 4 is eroded by etching, a dent (hole) corresponding to the size (volume) of the first adhesive layer 4 that has disappeared is formed in the first adhesive layer 4. In the method for repairing an electrostatic chuck device of the present embodiment, the dent is filled with a cold-curing adhesive, and the cold-curing adhesive is cured to repair the first adhesive layer 4 that has been eroded.

A method for filling the dent formed in the first adhesive layer 4 with the cold-curing adhesive is not particularly limited. For example, as a filling method, a filling method using a dispenser is preferable, and a method for injecting a cold-curing adhesive into a portion of the adhesive layer that has been eroded, under normal pressure, and then placing it under vacuum (reduced pressure) is preferable. As a result, a gas in the eroded portion is pushed out, and the adhesive enters the eroded portion. In addition, it is preferable to use a vacuum (reduced pressure) because the gas in the adhesive is released. As the dispenser, any dispenser can be selected.

The volume of the dent, in other words, the consumption amount of the adhesive layer may be checked by using a microscope such as a laser microscope. Filling may be performed while checking with a microscope. Any environmental temperature during filling and curing can be selected, but the environmental temperature may be, for example, 20° C. to 30° C., preferably 21° C. to 27° C., and more preferably 23° C. to 25° C. In addition, any temperature of the cold-curing adhesive during filling and curing can be selected, but the temperature may be, for example, −25° C. to 75° C., preferably 0° C. to 60° C., and more preferably 5° C. to 55° C. However, it is not limited only to these examples.

In addition, in the method for repairing an electrostatic chuck device of the present embodiment, the second adhesive layer 44 exposed at the first gas introduction hole 42 is repaired by using the cold-curing adhesive. In a case in which the second adhesive layer 44 is eroded by etching, a dent (hole) corresponding to the size (volume) of the second adhesive layer 44 that has disappeared is formed in the second adhesive layer 44. In the method for repairing an electrostatic chuck device of the present embodiment, the dent is filled with a cold-curing adhesive, and the cold-curing adhesive is cured to repair the second adhesive layer 44 that has been eroded.

The method of filling the dent formed in the second adhesive layer 44 with the cold-curing adhesive is not particularly limited, but for example, a method similar to the method of filling the dent formed in the first adhesive layer 4 with the cold-curing adhesive can be used.

A curing temperature of the cold-curing adhesive is preferably −25° C. or higher and 75° C. or lower, more preferably −10° C. or higher and 65° C. or lower, and still more preferably 0° C. or higher and 60° C. or lower. The curing temperature may be 10° C. or higher and 50° C. or lower, or 25° C. or higher and 40° C. or lower, as necessary.

In a case in which the curing temperature of the cold-curing adhesive is within the above range, the cold-curing adhesive can be cured without heating after filling the dent. Therefore, the protective layer 7 and the adhesive layer 8 are prevented from being delaminated due to the thermal expansion difference between the electrostatic chuck member 2 and the temperature-controlling base member 3 while the cold-curing adhesive is cured, and as a result, the separation of the electrostatic chuck member 2 from the temperature-controlling base member 3 can be prevented.

A viscosity of the cold-curing adhesive is preferably less than 100 Pa·s, more preferably 85 Pa·s or less, and still more preferably 75 Pa·s or less. As necessary, a viscosity may be 60 Pa·s or less, 40 Pa·s or less, or 25 Pa·s or less. Although any lower limit of the viscosity can be selected, it is, for example, 1 Pa·s.

In a case in which the viscosity of the cold-curing adhesive is within the above range, internal stress due to cure shrinkage of the cold-curing adhesive is less likely to occur in the first adhesive layer 4 and the second adhesive layer 44. Therefore, the protective layer 7 and the adhesive layer 8 are prevented from being delaminated due to the thermal expansion difference between the electrostatic chuck member 2 and the temperature-controlling base member 3 while the cold-curing adhesive is cured, and as a result, the separation of the electrostatic chuck member 2 from the temperature-controlling base member 3 can be prevented. In addition, in the electrostatic chuck device 1 after repair, it is possible to prevent the electrostatic chuck member 2 from being distorted. As a result, in the electrostatic chuck device 1 after repair, it is possible to suppress deterioration in heat uniformity and voltage resistance of the placement plate 11 on which the plate-shaped sample is placed.

The elastic modulus (Young's modulus) of the cold-curing adhesive is preferably 100 MPa or less, more preferably 85 MPa or less, and still more preferably 75 MPa or less. As necessary, the elastic modulus (Young's modulus) of the cold-curing adhesive may be 60 MPa or less, 40 MPa or less, 25 MPa or less, 10 MPa or less, or 5 MPa or less. Although any lower limit of the elastic modulus can be selected, it is, for example, 0.1 MPa.

In a case in which the elastic modulus of the cold-curing adhesive is within the above range, internal stress due to cure shrinkage of the cold-curing adhesive is less likely to occur in the first adhesive layer 4 and the second adhesive layer 44. Therefore, the protective layer 7 and the adhesive layer 8 are prevented from being delaminated due to the thermal expansion difference between the electrostatic chuck member 2 and the temperature-controlling base member 3 while the cold-curing adhesive is cured, and as a result, the separation of the electrostatic chuck member 2 from the temperature-controlling base member 3 can be prevented. In addition, in the electrostatic chuck device 1 after repair, it is possible to prevent the electrostatic chuck member 2 from being distorted. As a result, in the electrostatic chuck device 1 after repair, it is possible to suppress deterioration in heat uniformity and voltage resistance of the placement plate 11 on which the plate-shaped sample is placed.

Specific examples of the cold-curing adhesive include an acrylic resin, an epoxy resin, a silicone resin, and other resins. Among these, a silicone resin is particularly preferable from the viewpoint of workability during repair, elastic modulus during curing, or a case in which impurities generated when a resin is eroded are the same as impurities generated during wafer processing.

According to the method for repairing an electrostatic chuck device of the present embodiment, since the cold-curing adhesive is used to repair the first adhesive layer 4 and the second adhesive layer 44 of the electrostatic chuck device 1, which have been eroded by etching, the first adhesive layer 4 and the second adhesive layer 44 can be easily repaired. In addition, since the cold-curing adhesive is used to repair the first adhesive layer 4 and the second adhesive layer 44, the internal stress due to cure shrinkage of the cold-curing adhesive is less likely to occur in the first adhesive layer 4 and the second adhesive layer 44. Therefore, the protective layer 7 and the adhesive layer 8 are prevented from being delaminated due to the thermal expansion difference between the electrostatic chuck member 2 and the temperature-controlling base member 3 while the cold-curing adhesive is cured, and as a result, the separation of the electrostatic chuck member 2 from the temperature-controlling base member 3 can be prevented. In addition, in the electrostatic chuck device 1 after repair, it is possible to prevent the electrostatic chuck member 2 from being distorted. As a result, in the electrostatic chuck device 1 after repair, it is possible to suppress deterioration in heat uniformity and voltage resistance of the placement plate 11 on which the plate-shaped sample is placed.

EXAMPLES

Hereinafter, the present invention will be described more specifically with reference to Examples and Comparative Examples, but the present invention is not limited to the following Examples.

Manufacturing Electrostatic Chuck Device

An electrostatic chuck member in which an internal electrode for electrostatic attraction, which has a thickness of 20 µm, was embedded therein was manufactured by a known method.

A placement plate of the electrostatic chuck member was an aluminum oxide-silicon carbide composite sintered body containing 8.5% by mass of silicon carbide, and had a disk shape with a diameter of 298 mm and a thickness of 0.5 mm. In addition, an electrostatic attraction surface of this placement plate was formed to be an uneven surface by forming a large number of projection portions each of which has a height of 40 µm, and top surfaces of these projection portions were used as a holding surface for the plate-shaped sample, so that a cooling gas was allowed to flow through a groove formed between a recessed portion and the plate-shaped sample that has been electrostatically attracted.

In addition, similar to the placement plate, the supporting plate was also an aluminum oxide-silicon carbide composite sintered body containing 8.5% by mass of silicon carbide, and had a disk shape with a diameter of 298 mm and a thickness of 2 mm.

The entire thickness of the electrostatic chuck member formed by the placement plate and the supporting plate being bonded and integrated was 2.5 mm.

A cooling gas introduction hole penetrating the obtained electrostatic chuck member was formed in a thickness direction thereof.

On the other hand, an aluminum temperature-controlling base member having a diameter of 350 mm and a height of 30 mm was manufactured by machining. A flow path through which a cooling medium was circulated was formed inside the temperature-controlling base member.

A cooling gas introduction hole penetrating the temperature-controlling base member was formed in a thickness direction thereof.

In addition, a rectangular spacer having a width of 2,000 µm, a length of 2,000 µm, and a height of 100 µm was manufactured from an aluminum oxide sintered body.

Next, a surface (lower surface) of a supporting plate of the electrostatic chuck member was degreased and cleaned with acetone, and a sheet adhesive made of an epoxy resin having a thickness of 20 µm was adhered to a predetermined area of this surface to produce an adhesive layer.

Next, a titanium (Ti) thin plate with a thickness of 100 µm was placed on this adhesive layer. Next, the electrostatic chuck member and the titanium (Ti) thin plate were bonded and fixed by pressing and holding at 150° C. in a vacuum.

Next, the titanium (Ti) thin plate was etched into a heater pattern by photolithography to form a heater element. In addition, a titanium power supply terminal was installed to stand on the heater element by using a welding method.

As a result, an electrostatic chuck member with a heater element was obtained.

Next, a surface of the temperature-controlling base member bonded with the electrostatic chuck member was degreased and cleaned with acetone.

Next, a sheet adhesive made of an epoxy resin having a thickness of 20 µm was adhered, as an adhesive layer, to a predetermined position on this bonding surface.

Next, a polyimide film having a thickness of 50 µm was adhered, as an insulating member, to this sheet adhesive.

Next, the silicone-based resin composition was applied by screen printing onto the temperature-controlling base member on which the sheet adhesive and the polyimide film were laminated.

Next, the electrostatic chuck member and the temperature-controlling base member were laminated with the silicone-based resin composition sandwiched therebetween. At this time, the silicone-based resin composition was applied (injected) into a cooling gas introduction hole of the electrostatic chuck member and into a cooling gas introduction hole of the temperature-controlling base member.

Next, rectangular spacers were inserted into the cooling gas introduction hole of the electrostatic chuck member and the cooling gas introduction hole of the temperature-controlling base member with the silicone-based resin composition.

Next, the electrostatic chuck member and the temperature-controlling base member were brought close to each other until a distance between the heater element of the electrostatic chuck member and the temperature-controlling base member reached the height of the rectangular spacer, that is, 100 µm.

Thereafter, the electrostatic chuck member and the temperature-controlling base member were maintained at a temperature of 110° C. for 12 hours to cure the silicone-based resin composition, thereby forming a first adhesive layer between the electrostatic chuck member and the temperature-controlling base member, and the electrostatic chuck member and the temperature-controlling base member were bonded via the first adhesive layer. In addition, a second adhesive layer is formed in each of the cooling gas introduction holes of the electrostatic chuck member and the temperature-controlling base member, and a rectangular spacer was bonded to each of the cooling gas introduction holes via the second adhesive layer. As a result, an electrostatic chuck device was obtained.

Evaluation of In-Plane Temperature Distribution

The in-plane temperature distribution of the electrostatic chuck device was evaluated.

While circulating cooling water of 20° C. in the flow path of the temperature-controlling base member, an outer heater and an inner heater of the heater element were energized so that the center temperature of the placement surface of the electrostatic chuck member became 60° C., and the in-plane temperature of the silicon wafer at that time was measured by using a thermography TVS-200EX (manufactured by Nippon Avionics Co., Ltd.). The difference between the maximum in-plane temperature and the minimum in-plane temperature was defined as the in-plane temperature distribution.

[Test Example]

The in-plane temperature distribution of the electrostatic chuck device obtained as described above was evaluated by the method described above. The result of the test example is illustrated in Table 1.

Erosion of Adhesive Layer

The electrostatic chuck device obtained as described above was secured in a vacuum chamber, and a placing test was performed for 3,000 hours in a plasma environment, and the first adhesive layer and the second adhesive layer were consumed by the plasma.

Confirmation of Consumption Amount of Adhesive Layer: Outer Peripheral Portion, First Adhesive Layer By using a laser microscope (trade name: VK-X100, manufactured by Keyence Corporation), the consumption amount of the first adhesive layer in the outer peripheral portion of the electrostatic chuck device was checked. The deepest part of the first adhesive layer from a thermally sprayed portion of a base was taken as the consumption amount of the adhesive layer. The consumption amount of the first adhesive layer after carrying out the placing test for 3,000 hours was in a range of 0.95 mm to 1.34 mm based on the temperature-controlling base member.

Confirmation of Consumption Amount of Adhesive Layer: Insulator Portion, Second Adhesive Layer By using a microfocus X-ray CT apparatus (trade name: TOSCANER-30000 μCM, manufactured by TOSHIBA IT & CONTROL SYSTEMS CORPORATION), the consumption amount of the second adhesive layer in the insulator portion of the electrostatic chuck device was checked. The consumption amount of the second adhesive layer after carrying out the placing test for 3,000 hours was in a range of 0.95 mm to 1.34 mm based on the temperature-controlling base member.

[Comparative Example 1]

The in-plane temperature distribution of the electrostatic chuck device in which the first adhesive layer and the second adhesive layer were consumed as described above was evaluated by the above method. The result of Comparative Example 1 is illustrated in Table 1.

EXAMPLE

The consumed portions of the first adhesive layer and the second adhesive layer were filled with a cold-curing silicone adhesive (trade name: KE-4895T, viscosity: 5 Pa·s, manufactured by Shin-Etsu Chemical Co., Ltd.) by using a dispenser. The cold-curing silicone adhesive was then cured at room temperature (23° C.) for 24 hours.

The in-plane temperature distribution of the electrostatic chuck device repaired with the cold-curing silicone adhesive was evaluated by the above method. The result of Example is illustrated in Table 1.

[Comparative Example 2]

The consumed portions of the first adhesive layer and the second adhesive layer were filled with a heat-curing silicone adhesive (trade name: KE-1886, viscosity: 14 Pa·s, manufactured by Shin-Etsu Chemical Co., Ltd.) by using a dispenser. The heat-curing silicone adhesive was then cured at 110° C. for 12 hours.

The in-plane temperature distribution of the electrostatic chuck device repaired with the heat-curing silicone adhesive was evaluated by the above method. The result of Comparative Example 2 is illustrated in Table 1.

TABLE 1

|  | Test Example | Comparative Example 1 | Comparative Example 2 | Example |
|---|---|---|---|---|
| In-plane temperature distribution [° C.] | 2.3 | 3.4 | 6.1 | 2.3 |

From the results in Table 1, it was confirmed that the in-plane temperature distribution in Example was the same as that in the test example before the first adhesive layer and the second adhesive layer were consumed.

In Comparative Example 2, it was considered that since the adhesive force between the sheet adhesive made of an epoxy resin and the temperature-controlling base member made of aluminum was reduced, the electrostatic chuck member and the temperature-controlling base member were separated due to thermal expansion in a case of heating of the heat-curing silicone adhesive with which the consumed portions of the first adhesive layer and the second adhesive layer were filled.

INDUSTRIAL APPLICABILITY

The present invention is to provide the method for repairing an electrostatic chuck device capable of easily repairing an adhesive layer of the electrostatic chuck device that has been eroded by etching and capable of preventing the occurrence of internal stress in the adhesive layer after repair.

REFERENCE SIGNS LIST

1: Electrostatic chuck device
2: Electrostatic chuck member
3: Temperature-controlling base member
4: Adhesive layer (first adhesive layer)
5: Heater element
6: Organic insulating adhesive layer
7: Protective layer
8: Adhesive layer (third adhesive layer)
9: Adhesive
11: Placement plate
11a: Placement surface
12: Supporting plate
13: Electrostatic attraction electrode
14: Insulating material
21: Flow path
22: Fixing hole (first fixing hole)
23: Fixing hole (second fixing hole)
31: Insulating material
32: Electrode pin
33: Insulating material
34: Electrode pin
35: Connection terminal
36: Connection line
41: Fixing hole (third fixing hole)
42: Gas introduction hole (first gas introduction hole)
43: Insulator
44: Adhesive layer (second adhesive layer)
45: Through-hole (gas introduction hole, second gas introduction hole)

The invention claimed is:

1. A method for repairing an electrostatic chuck device in which an electrostatic chuck member made of ceramics and a temperature-controlling base member made of metal are bonded together by a first adhesive layer formed from a thermosetting adhesive having a thermosetting temperature of 70° C. to 140° C. sandwiched therebetween, the method comprising:
   a step of repairing the first adhesive layer that has been eroded by using a cold-curing adhesive having a curing temperature of 0° C. or higher and 60° C. or lower.

2. The method for repairing an electrostatic chuck device according to claim 1,
   wherein in the step of repairing the first adhesive layer, the first adhesive layer that has been eroded is repaired at a position between an outer periphery of the electrostatic chuck member and the temperature-controlling base member.

3. The method for repairing an electrostatic chuck device according to claim 1,
wherein a cooling gas introduction hole is provided to penetrate through the electrostatic chuck member and the temperature-controlling base member in a thickness direction thereof,
an insulator made of ceramics is provided in the cooling gas introduction hole to be bonded to a second adhesive layer, and
the method further includes a step of repairing the second adhesive layer that has been eroded by using a cold-curing adhesive.

4. The method for repairing an electrostatic chuck device according to claim 1,
wherein a viscosity of the cold-curing adhesive is less than 100 Pa·s.

5. The method for repairing an electrostatic chuck device according to claim 1,
wherein an elastic modulus of the cold-curing adhesive is 100 MPa or less.

6. The method for repairing an electrostatic chuck device according to claim 1 further comprising:
a step of carrying out plasma etching by using the electrostatic chuck device to erode the first adhesive layer before the step of repairing the first adhesive layer.

7. The method for repairing an electrostatic chuck device according to claim 1 further comprising:
a step of carrying out plasma CVD by using the electrostatic chuck device to erode the first adhesive layer before the step of repairing the first adhesive layer.

8. The method for repairing an electrostatic chuck device according to claim 1,
wherein the step of repairing the first adhesive layer includes a sub-step of filling a dent generated by erosion of the first adhesive layer with the cold-curing adhesive at a normal pressure by using a dispenser.

9. The method for repairing an electrostatic chuck device according to claim 8,
wherein the step of repairing the first adhesive layer includes a sub-step of curing the adhesive filled in the dent.

10. The method for repairing an electrostatic chuck device according to claim 8,
wherein the step of repairing the first adhesive layer includes a sub-step of placing the electrostatic chuck device under a reduced pressure after the sub-step of filling the dent.

11. The method for repairing an electrostatic chuck device according to claim 8,
wherein a sub-step of observing the dent generated by the erosion of the first adhesive layer with a microscope is further provided before the sub-step of filling the dent.

12. The method for repairing an electrostatic chuck device according to claim 1,
wherein the first adhesive layer is formed of a silicone resin, an acrylic resin, or an epoxy resin, and
the cold-curing adhesive is made of a silicone resin, an acrylic resin, or an epoxy resin.

13. The method for repairing an electrostatic chuck device according to claim 12,
wherein the first adhesive layer is formed of a silicone resin, and
the cold-curing adhesive is made of a silicone resin.

* * * * *